(12) United States Patent
Kealy et al.

(10) Patent No.: US 9,361,167 B2
(45) Date of Patent: Jun. 7, 2016

(54) BIT ERROR RATE ESTIMATION FOR WEAR LEVELING AND FOR BLOCK SELECTION BASED ON DATA TYPE

(71) Applicants: Kevin Patrick Kealy, Edinburgh (GB); Alan David Bennett, Edinburgh (GB)

(72) Inventors: Kevin Patrick Kealy, Edinburgh (GB); Alan David Bennett, Edinburgh (GB)

(73) Assignee: SanDisk Technologies, Inc., Plano, TX (US)

( * ) Notice: Subject to any disclaimer, the term of this patent is extended or adjusted under 35 U.S.C. 154(b) by 6 days.

(21) Appl. No.: 13/659,549

(22) Filed: Oct. 24, 2012

(65) Prior Publication Data

US 2014/0115410 A1 Apr. 24, 2014

(51) Int. Cl.
*G06F 11/00* (2006.01)
*G06F 12/02* (2006.01)
*G11C 16/34* (2006.01)

(52) U.S. Cl.
CPC .............. *G06F 11/008* (2013.01); *G06F 11/00* (2013.01); *G06F 12/0246* (2013.01); *G06F 2212/1032* (2013.01); *G06F 2212/7211* (2013.01); *G11C 16/349* (2013.01)

(58) Field of Classification Search
CPC ........... H04L 1/20; H04L 1/24; H04L 1/0061; G06F 11/076; G01R 31/3171
USPC ......................................................... 714/704
See application file for complete search history.

(56) References Cited

U.S. PATENT DOCUMENTS

| 7,310,347 | B2 | | 12/2007 | Lasser | |
|---|---|---|---|---|---|
| 2004/0121261 | A1 | * | 6/2004 | Ashida et al. | 430/270.13 |
| 2007/0086239 | A1 | | 4/2007 | Litsyn et al. | |
| 2007/0089034 | A1 | | 4/2007 | Litsyn et al. | |
| 2007/0121741 | A1 | * | 5/2007 | Tang et al. | 375/260 |
| 2010/0005370 | A1 | | 1/2010 | Litsyn et al. | |
| 2010/0064096 | A1 | * | 3/2010 | Weingarten | G06F 12/0246 711/103 |
| 2010/0262792 | A1 | | 10/2010 | Hetzler et al. | |
| 2011/0138103 | A1 | | 6/2011 | Iiiadis et al. | |
| 2011/0296088 | A1 | * | 12/2011 | Duzly et al. | 711/103 |
| 2012/0290768 | A1 | * | 11/2012 | Rubowitz | 711/103 |
| 2013/0047045 | A1 | * | 2/2013 | Hu et al. | 714/708 |
| 2013/0131806 | A1 | * | 5/2013 | Carpenter | 623/17.12 |
| 2013/0339574 | A1 | * | 12/2013 | Franceschini et al. | 711/103 |

OTHER PUBLICATIONS

Olson, Alan R., "Solid State Drives Data Reliability and Lifetime", Apr. 7, 2008 (27 pgs).
Application as filed Dec. 19, 2011 for U.S. Appl. No. 13/330,217 (39 pgs).

* cited by examiner

*Primary Examiner* — Albert Decady
*Assistant Examiner* — Enam Ahmed
(74) *Attorney, Agent, or Firm* — Brinks Gilson & Lione

(57) ABSTRACT

A method and system for wear balancing in a flash memory device using bit error probability is disclosed. The flash memory device includes blocks with different life spans, leading potentially to one block wearing out before the other. In order to avoid this, a controller is configured to determine a bit error probability of a block and determine, based on the bit error probability, whether to select the block for storage of data. A method and system for selecting a block in a flash memory device based on the type of data is disclosed. The type of data may comprise flash management data (which may be used to manage the flash memory device) and host data. An indication of age associated with the block (such as bit error probability) is analyzed in order to determine whether to store the data in the block based on the type of data.

28 Claims, 14 Drawing Sheets

BIT ERROR RATE ESTIMATION FOR WEAR LEVELING AND FOR BLOCK SELECTION BASED ON DATA TYPE

TECHNICAL FIELD

This application relates generally to managing data in a memory system. More specifically, this application relates to balancing wear and to selecting blocks based on data type using bit error rate estimation.

BACKGROUND

Non-volatile memory systems, such as flash memory devices, have been widely adopted for use in consumer products. Flash memory devices may be found in different forms, for example in the form of a portable memory card that can be carried between host devices or as a solid state disk (SSD) embedded in a host device. When writing data to a conventional flash memory device, a host typically writes data to, and reads data from, addresses within a logical address space of the memory system. For example, the memory in the flash memory device may be divided into blocks, in which data from the host is written. To write data into a block of the flash memory device, the block is erased and then programmed by writing data into the cells of the block. Each time a block undergoes a program/erase (P/E) cycle, a counter may be incremented. The total number of P/E cycles for a respective block may be designated as the erased count or the "hot count" for the respective block.

Through use, the blocks in the flash memory device may eventually fail. Therefore, flash memory devices typically attempt to level the wear across the blocks. In particular, wear levelling attempts to selects blocks so that erasures and re-writes are distributed evenly across the blocks. In this way, no single erase block prematurely fails due to a high concentration of write cycles. To accomplish the wear leveling, the flash memory device relies on the erased count of the blocks, selecting blocks with lower erased counts in the expectation of more evenly distributing the wear across the memory in the flash memory device.

BRIEF SUMMARY

According to one aspect, a method for selecting a free block for erasing in a portable storage device is disclosed. The method includes: accessing a first bit error probability for a first free block in the storage device; accessing a second bit error probability for a second free block in the storage device; comparing the first bit error rate probability with the second bit error rate probability in order to determine which of the first free block or the second free block has a lower bit error rate probability; and selecting as the free block for erasing the first free block or the second free block with the lower bit error rate probability.

According to a second aspect, a memory device is disclosed. The memory device includes a memory and a controller. The controller is in communication with the memory and is configured to: access a first bit error probability for a first free block in the memory; access a second bit error probability for a second free block in the memory; compare the first bit error rate probability with the second bit error rate probability in order to determine which of the first free block or the second free block has a lower bit error rate probability; and select as the free block for erasing the first free block or the second free block with the lower bit error rate probability.

According to a third aspect, a method for selecting a block for storing data in a portable storage device. The method comprises: determining a type of the data for storage in the block, the type of data selected from a plurality of types of data; analyzing at least one indication of age associated with the block; and determining whether to store the data in the block based on the type of data and the at least one indication of age associated with the block. The plurality of types of data may comprise flash management data (e.g., data used to manage the flash memory device) and host data (e.g., data sent from the host for storage in the portable storage device. The indication of age may comprise a bit error probability associated with the block (e.g. a bit error rate estimation associated with the block). In one example, the block may be tagged for storage of flash management data or host data based on a comparison of the bit error probability with a predetermined threshold.

According to a fourth aspect, a memory device is disclosed. The memory device includes a memory and a controller. The controller is in communication with the memory and is configured to: determine a type of the data for storage in the block, the type of data selected from a plurality of types of data; analyze at least one indication of age associated with the block; and determine whether to store the data in the block based on the type of data and the at least one indication of age associated with the block.

Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

A flash memory system suitable for use in implementing aspects of the invention is shown in FIGS. 1-4. A host system 100 of FIG. 1 stores data into and retrieves data from a memory system 110. The memory system 110 is an example of a storage device and may be flash memory embedded within the host, such as in the form of a solid state disk (SSD) drive installed in a personal computer. Alternatively, the memory system 110 may be in the form of a card that is removably connected to the host through mating parts and of a mechanical and electrical connector (not shown). A flash memory configured for use as an internal or embedded SSD drive may look similar to the schematic of FIG. 1, with the primary difference being the location of the memory system 110 internal to the host 100. SSD drives may be in the form of discrete modules that are drop-in replacements for rotating magnetic disk drives.

One example of a commercially available SSD drive is a 32 gigabyte SSD produced by SanDisk Corporation. Examples of commercially available removable flash memory cards include the CompactFlash (CF), the MultiMediaCard (MMC), Secure Digital (SD), miniSD, Memory Stick, and TransFlash cards. Although each of these cards has a unique mechanical and/or electrical interface according to its standardized specifications, the flash memory system included in each is similar. These cards are all available from SanDisk Corporation. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, cellular telephones, personal digital assistants (PDAs), digital still cameras, digital movie cameras and portable audio players. For portable memory card applications, a host may include a built-in receptacle for one or more types of memory cards or flash drives, or a host may require adapters into which a memory card is plugged. The memory system usually contains its own memory controller and drivers but there are also some memory-only systems that are instead controlled by software executed by the host to which the memory is connected. In some memory systems containing the controller, especially those embedded within a host, the memory, controller and drivers are often formed on a single integrated circuit chip.

Figure 1:
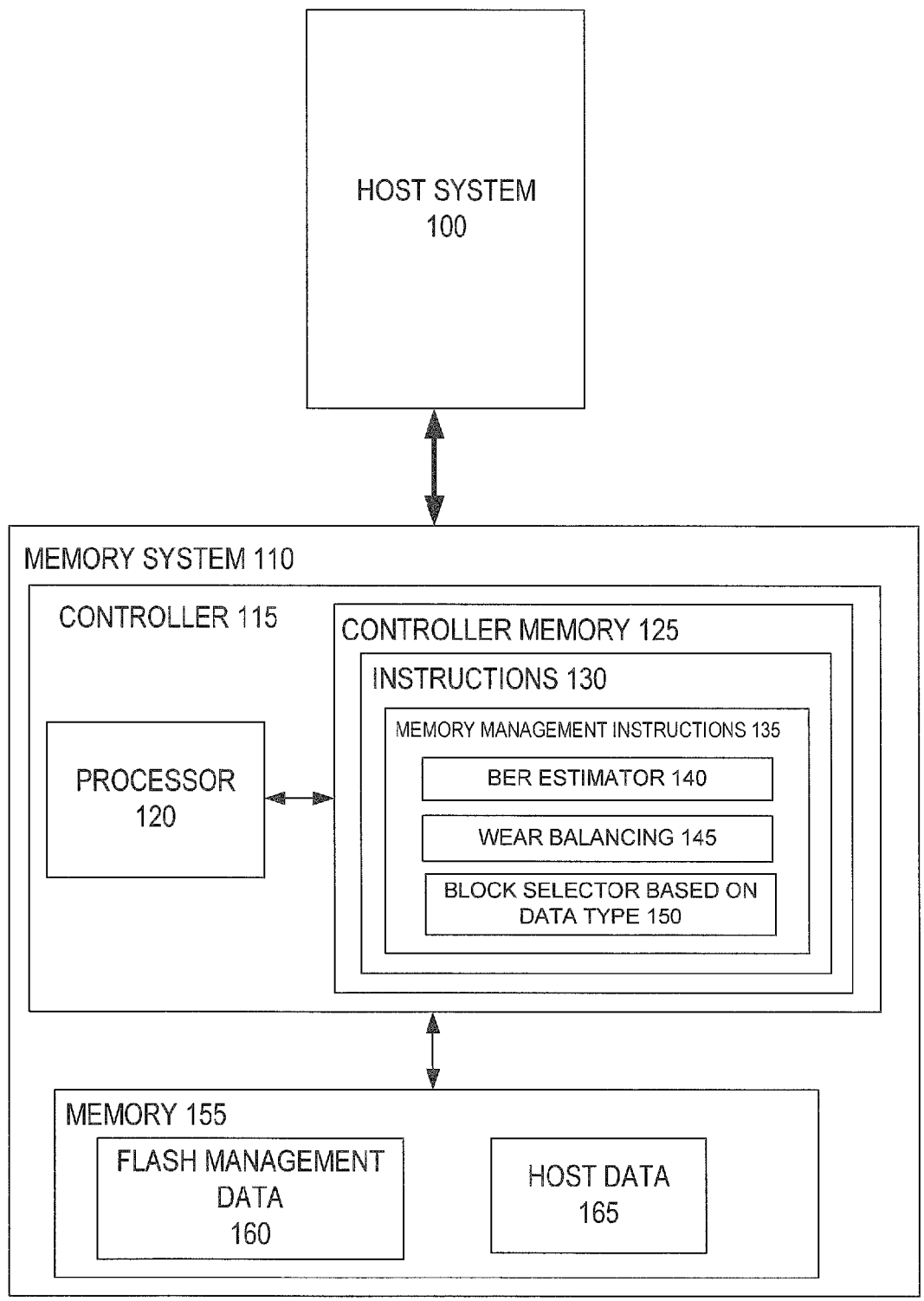
FIG. 1 illustrates a host connected with a memory system having non-volatile memory.
Figure 2:
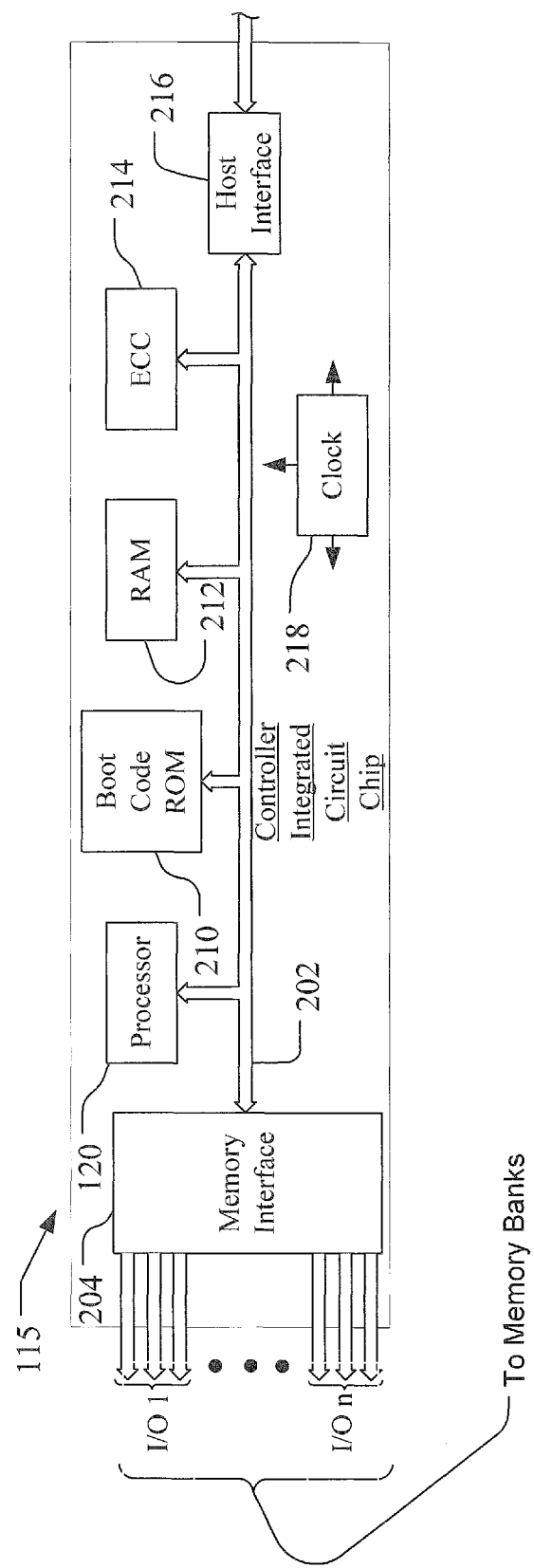
FIG. 2 is an example block diagram of an example flash memory system controller for use in the non-volatile memory of FIG. 1.

FIG. 1 illustrates the memory system 110 as including the controller 115 and the memory 155. As discussed in more detail below, memory 155 may include non-volatile memory. In one embodiment, the non-volatile memory may include multi-bank flash memory, discussed in more detail below. In an alternative embodiment, the non-volatile memory may include a single bank flash memory.

The controller 115 interfaces with the host system 100 to which the memory system 110 is connected for passing data back and forth, and controls the memory 155. The data passed back and forth between the host system 100 and the memory system 110 may be designated as host data, and may be stored in host data blocks, as discussed in more detail below. The memory system 110 may also store flash management data, which are data enabling the memory system 110 to manage the host data. One example of flash management data is control data, which the controller 115 may use for addressing memory locations, control and status. Generally speaking, one example use of control data is to convert between logical addresses of data used by the host 100 and physical addresses of the memory 155 during data programming and reading. Further, the memory system 110 may use control data for other uses, such as to recover host data in the event of a power interruption, as discussed in more detail below.

Different types of control data may be used, including relatively static control data and frequently changing and accessed control data, as discuss in U.S. Pat. No. 8,051,257, hereby incorporated by reference herein in its entirety. Control data that is relatively static includes, for example, group address tables (GAT), chaotic block indices (CBI), erased block lists (EBL) and MAP. The GAT 210 keeps track of the mapping between logical groups of sectors and their corresponding metablocks. The mappings do not change except for those undergoing updates. The CBI keeps track of the mapping of logically non-sequential sectors during an update. The EBL keeps track of the pool of metablocks that have been erased. MAP is a bitmap showing the erase status of all metablocks in the flash memory.

Control data that are frequently changing and accessed includes, for example, an allocation block list (ABL) and a cleared block list (CBL). The ABL keeps track of the allocation of blocks (or metablocks) for recording update data while the CBL keeps track of blocks (or metablocks) that have been deallocated and erased. The examples of the control data, including relatively static and frequently changing, are for illustration purposes only. Other control data are contemplated.

Functionally, the controller 115 includes a processor 120 and controller memory 125. The controller memory includes instructions 130 for execution by the processor 120 in order for the controller 115 to perform certain functions including: interfacing with the host system 100; coordinating operation of the memory 155; and flash management logic for internal memory management operations such as system initiation, writing data within a block, bad block management and handling block linkage information. FIG. 1 illustrates memory management instructions 135, which may include bit error rate (BER) estimator 140, wear balancing 145, and block selector based on data type 150, each of which is discussed below.

The processor 120 of the controller 115 may, for example, be configured as a multi-thread processor capable of communicating separately with each of the respective memory banks via a memory interface 204 having I/O ports for each of the respective banks in the memory 155. The controller 115 may include an internal clock 218. The processor 120 communicates with an error correction code (ECC) module 214, a RAM buffer 212, a host interface 216, and boot code ROM 210 via an internal data bus 202.

Figure 3:
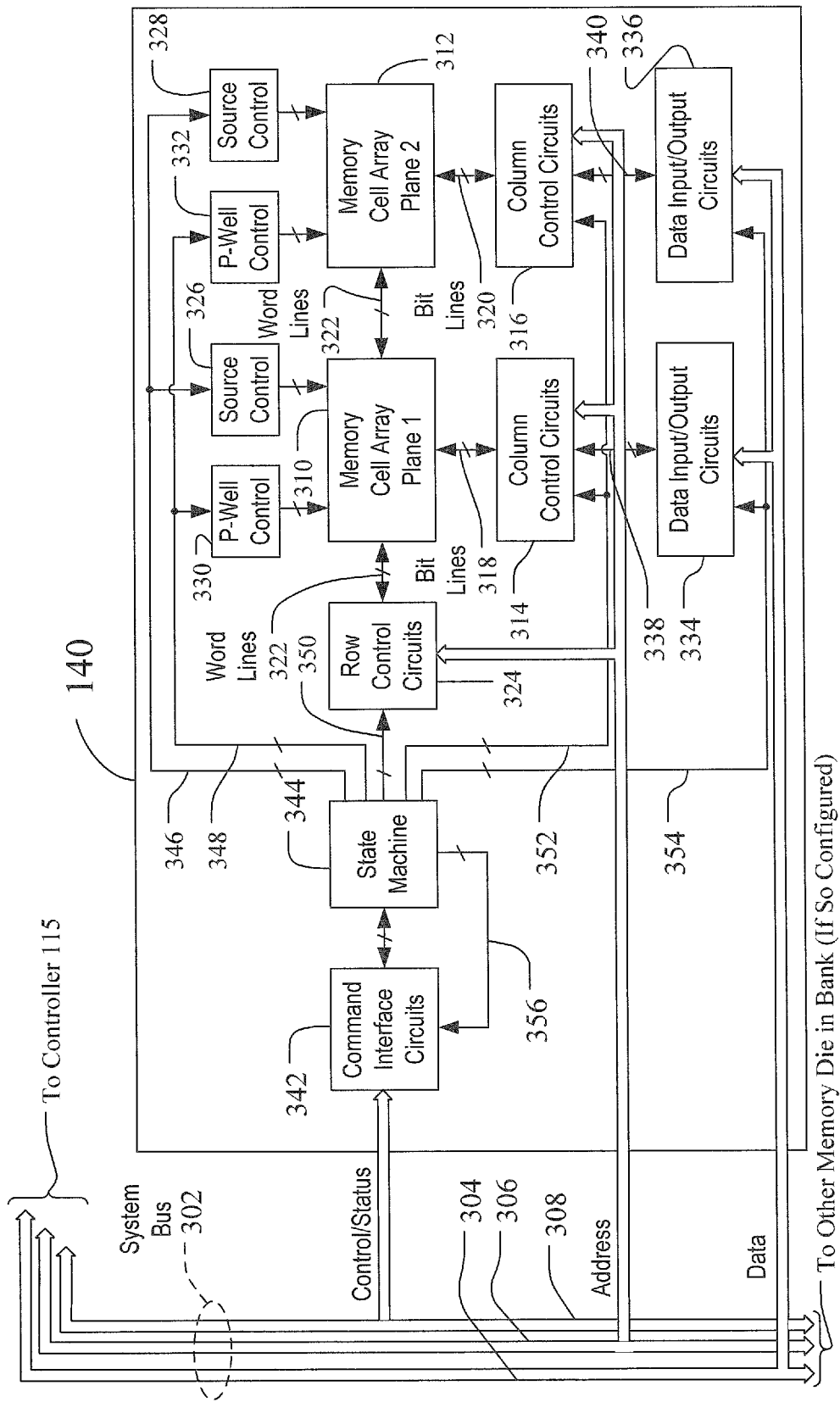
FIG. 3 is an example one flash memory bank suitable as one of the non-volatile memory banks for the memory system illustrated in FIG. 1.

Each die in the memory 155 may contain an array of memory cells organized into multiple planes. FIG. 3 shows one of such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 120 in the controller 115 controls the operation of the memory chips in each bank 120 to program data, read data, erase and attend to various housekeeping matters, each memory chip may also contain some controlling circuitry that executes commands from the controller 115 to perform such functions. Interface circuits 342 are connected to the control and status portion 308 of the system bus 302. Commands from the controller 115 are provided to a state machine 344 that then provide specific control of other circuits in order to execute these commands. Control lines 346-354 connect the state machine 344 with these other circuits as shown in FIG. 3. Status information from the state machine 344 is communicated over lines 356 to the interface 342 for transmission to the controller 115 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
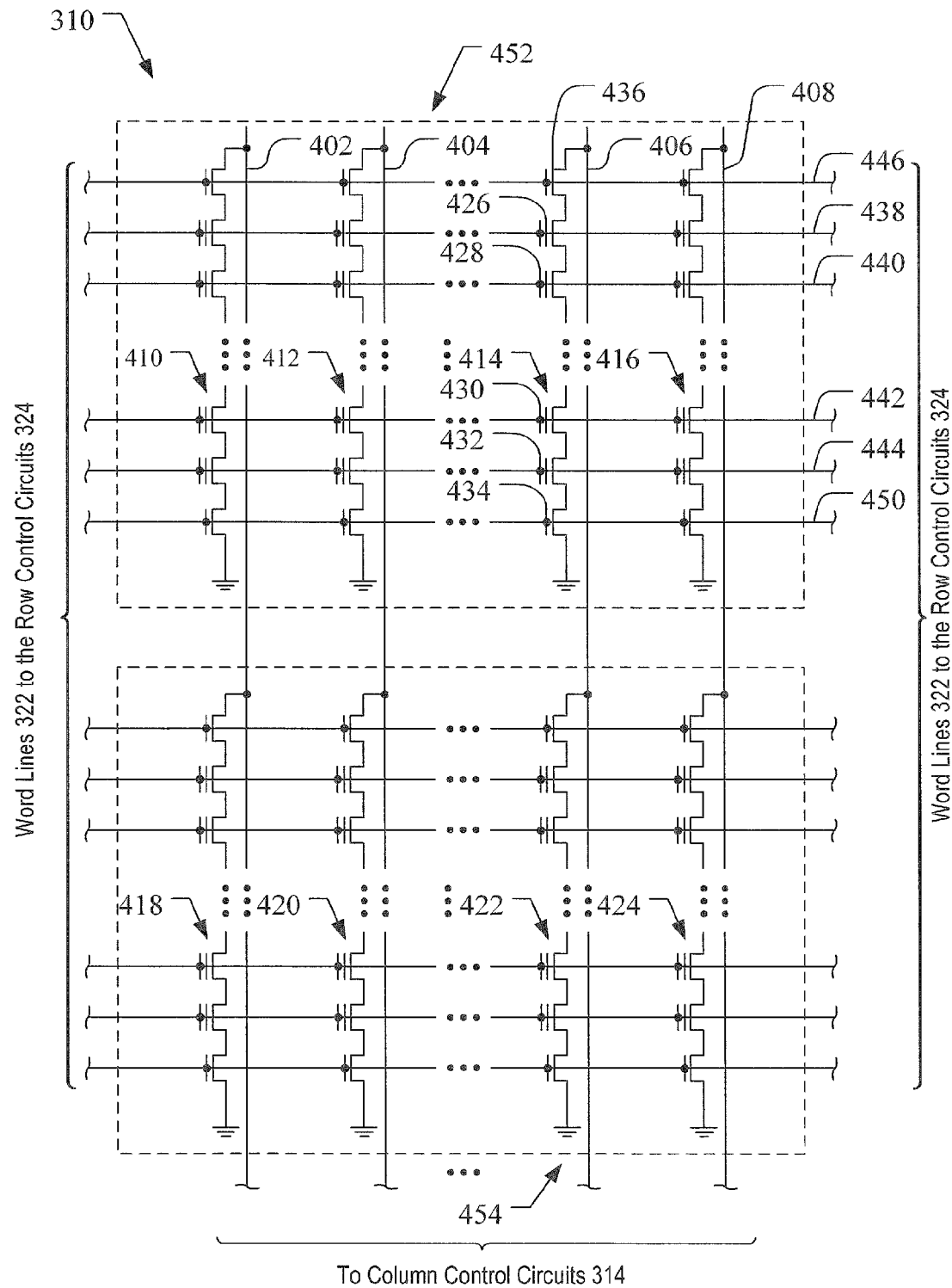
FIG. 4 is a representative circuit diagram of a memory cell array that may be used in the memory bank of FIG. 3.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. The row along the word line 438 is programmed last.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 5:
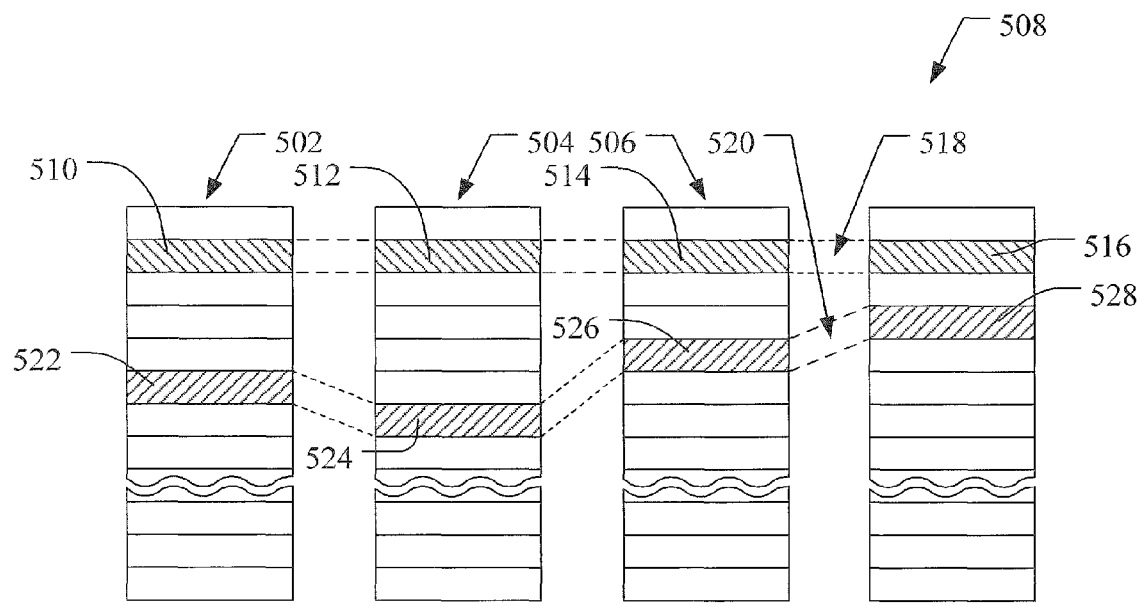
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory device can be operated with the ability to dynamically form metablocks of any or all of one, two or three blocks in different planes. This allows the size of the metablock to be more closely matched with the amount of data available for storage in one programming operation.

Figure 6:
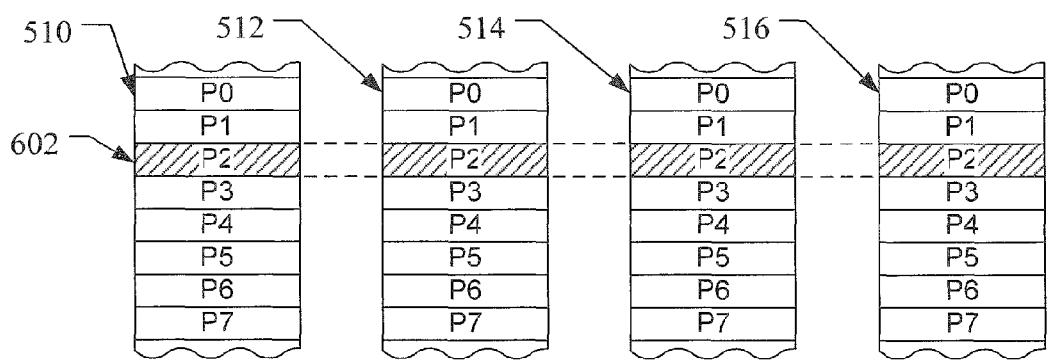
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory device operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a die, a metapage is the maximum unit of programming.

As discussed above, the memory system 110 uses blocks of flash memory for various types of storage, such as for storage of host data or flash management data. At times, the memory system may recycle blocks of flash memory that have been made redundant in the memory system 110 in order for the memory system 110 to reuse the recycled blocks. In one aspect, the memory system 110 is configured to level the wear for blocks in the memory. Before a block is made available to the memory system, the memory system 110 may analyze whether the block is in good working order. One method to analyze whether the block is in good working order to examine the erased count for the block. In particular, the memory system 110 may assume that blocks that have been erased fewer number of times are in better working order than blocks that have been erased a greater number of times. In this method, from a given pool of available blocks, a block with the lowest erased count is selected for use.

However, erased count may not be a reliable indicator as to the wear of a block. So that, relying on erased count (such as solely relying on erased count) may be inadvisable when attempting to level wear across blocks in the memory system 110. Rather, a better indication of deterioration or wear of a block may be a probability of error of the block. For example, the memory system 110 is configured to analyze one or more blocks in the free block pool, such as using Bit Error Rate Estimation (discussed below in more detail), in order to select a block from the free block pool. Analysis of the block may be performed as the block is made available to the free block list. More specifically, the BER estimator 140 may profile the block and create an error rate for that block when the block is made available to the free block list. Alternatively, the analysis of the block may be performed when a free block is needed.

The free block list may be sorted to indicate blocks with lower bit error rates. For example, blocks may be sorted in descending to ascending error rate, making the blocks with the lowest error rate available to the memory system 110. As discussed in more detail below, given a tie in error rates, the block with the lowest erased count is given priority in the sorting of the free block list. In this way, the memory system 110 may dynamically and constantly update the selection of free blocks.

Figure 7:
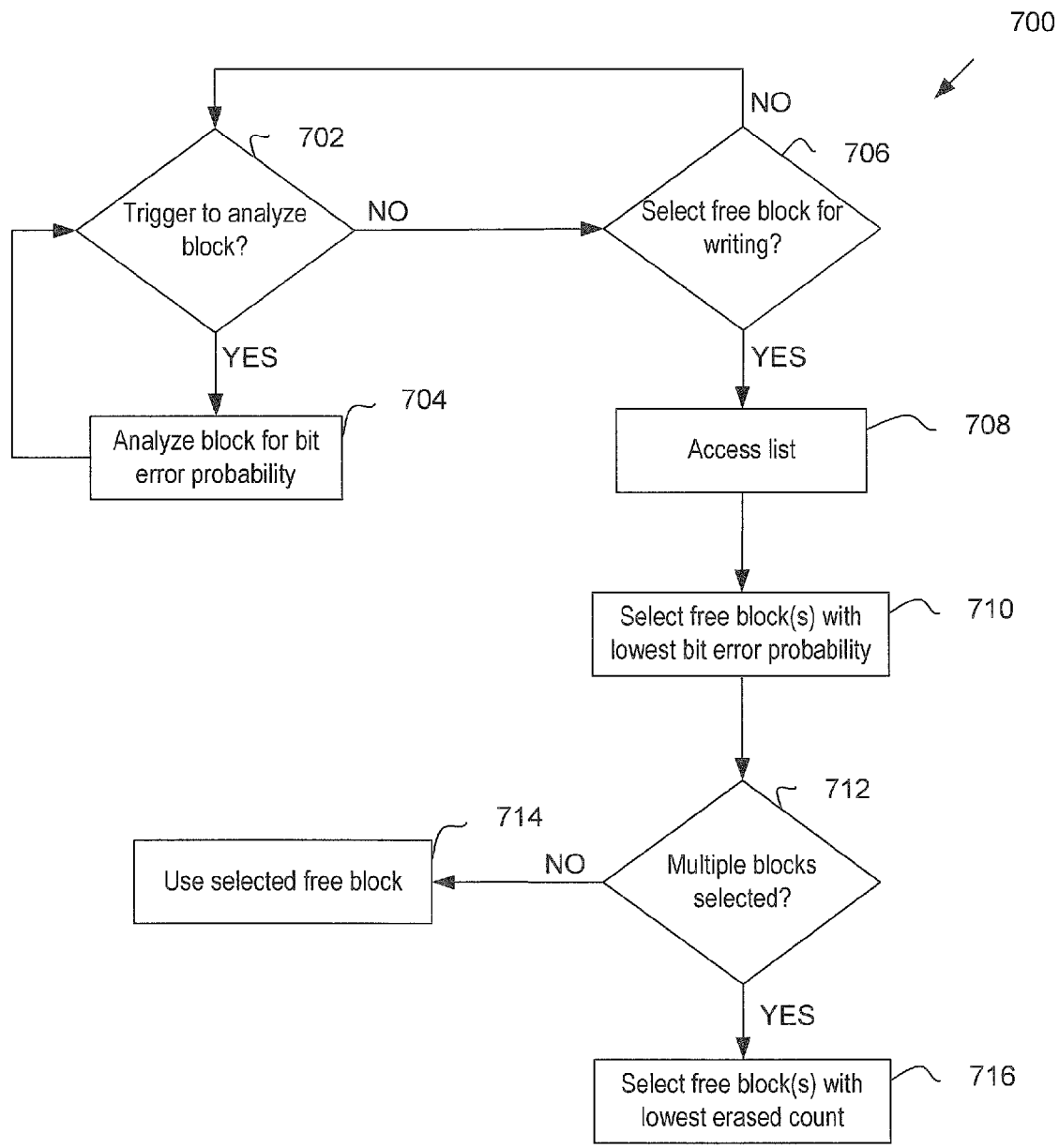
FIG. 7 illustrates a flow chart of wear balancing using bit error probability.

FIG. 7 illustrates a flow chart 700 of wear balancing using bit error probability. The processor 120, executing wear balancing instruction 145, may achieve the functionality described in flow chart 700. At 702, it is determined whether to trigger the analysis of the block. As discussed above, the analysis of the block may be triggered at one of several stages, including as the block is made available to the free block list. If it is determined to analyze the block, at 704, the block is analyzed for bit error probability.

Figure 8:
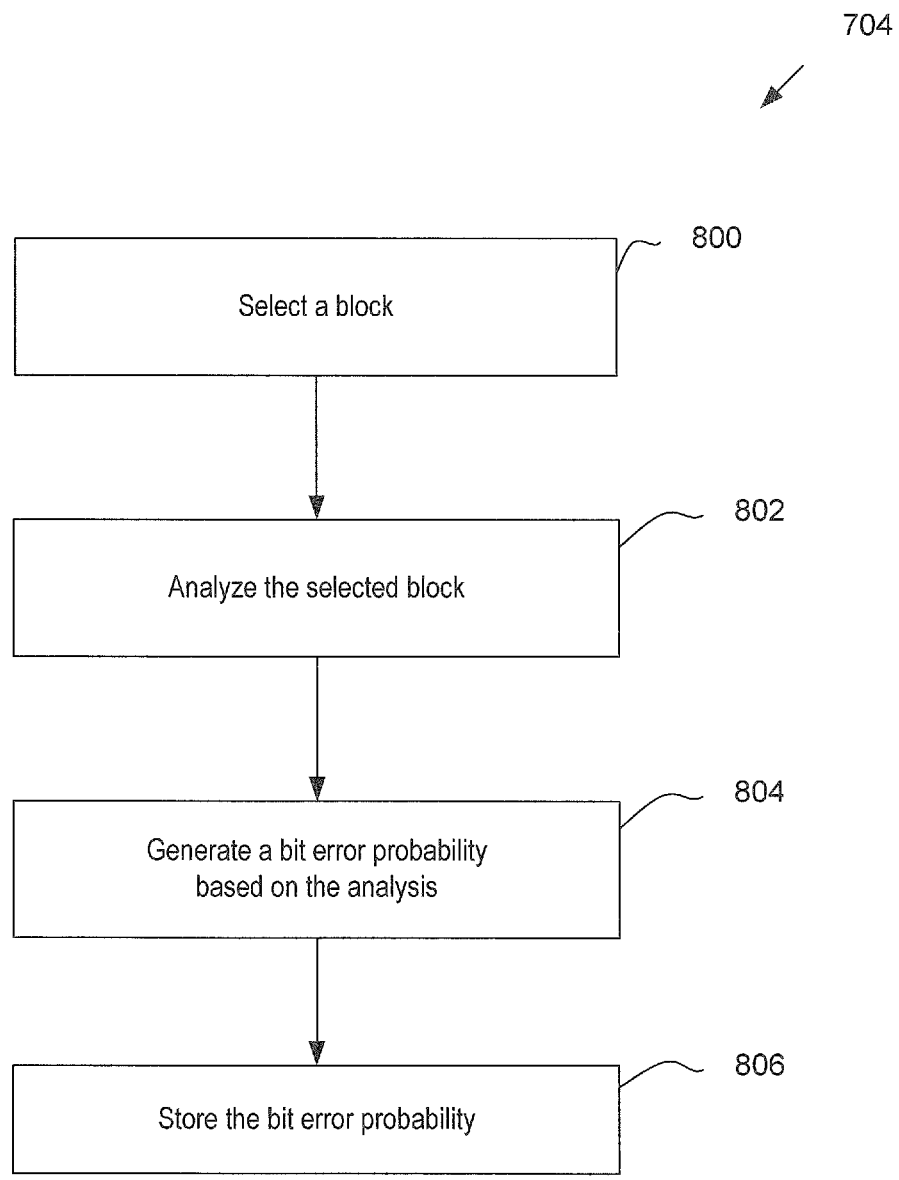
FIG. 8 illustrates a flow chart to generate the bit error probability that is used in FIG. 7.

FIG. 8 illustrates an expansion of 704, illustrating analysis of the bit error probability. At 800, the block for analysis is selected. At 802, the block is analyzed. One example of the analysis is disclosed in U.S. application Ser. No. 12/401,629 (U.S. Published Application No. 2010/0005370), incorporated by reference herein in its entirety. The analysis may generate an indication of reliability of the block, and may be based on analysis of the bits in the block. In one example, the analysis may comprise reading one or more bits from the block and inferring a reliability of the read bits from the values of the read bits (e.g., using reliability information derived from correlation between different bits sharing a common cell). Alternatively, the analysis may comprise utilizing reliability information derived from the locations in which individual bits are stored within the cells of the memory device 110.

Figure 9:
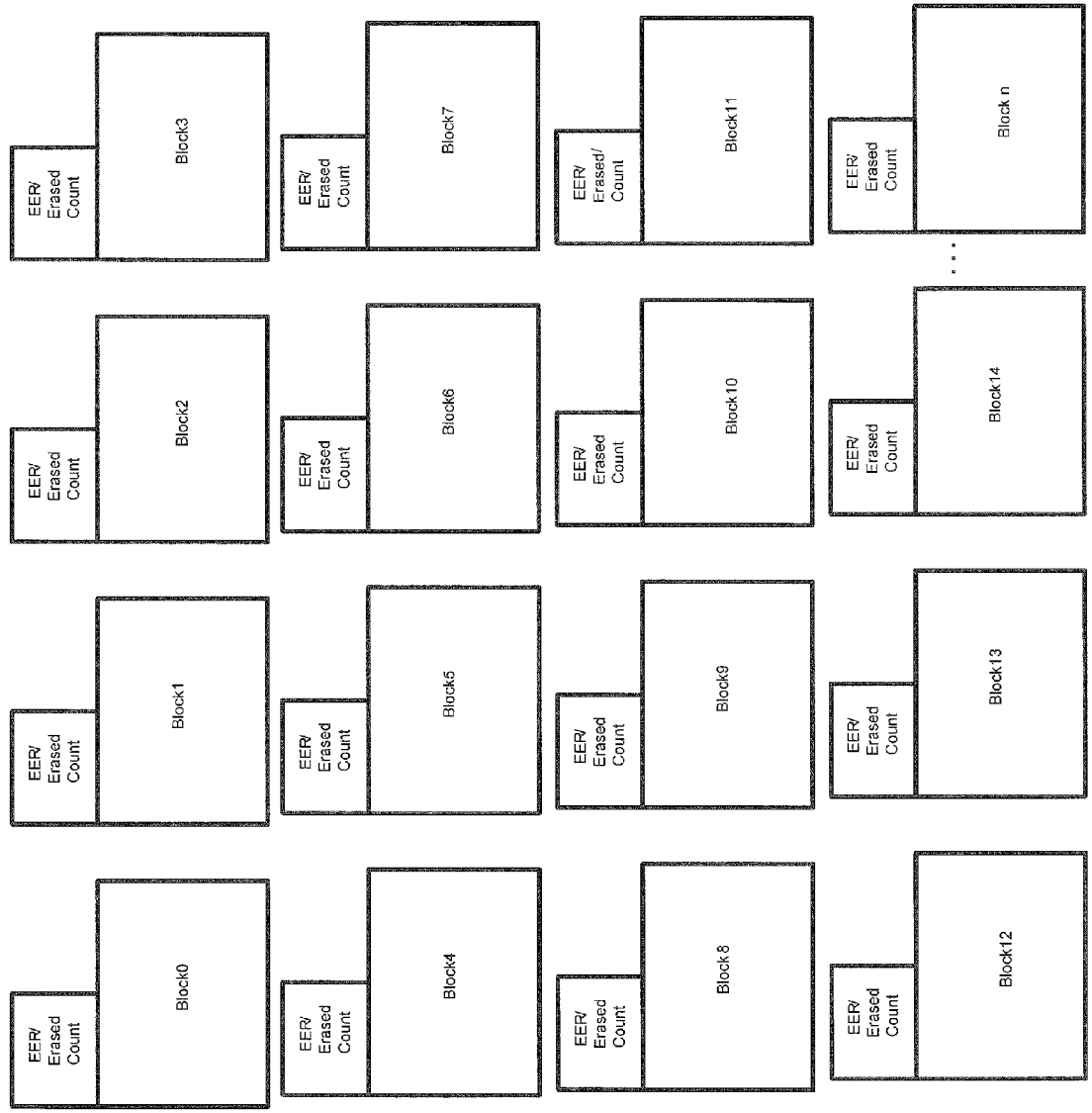
FIG. 9 illustrates a plurality of blocks with associated bit error rates and erased counts.
Figure 10:
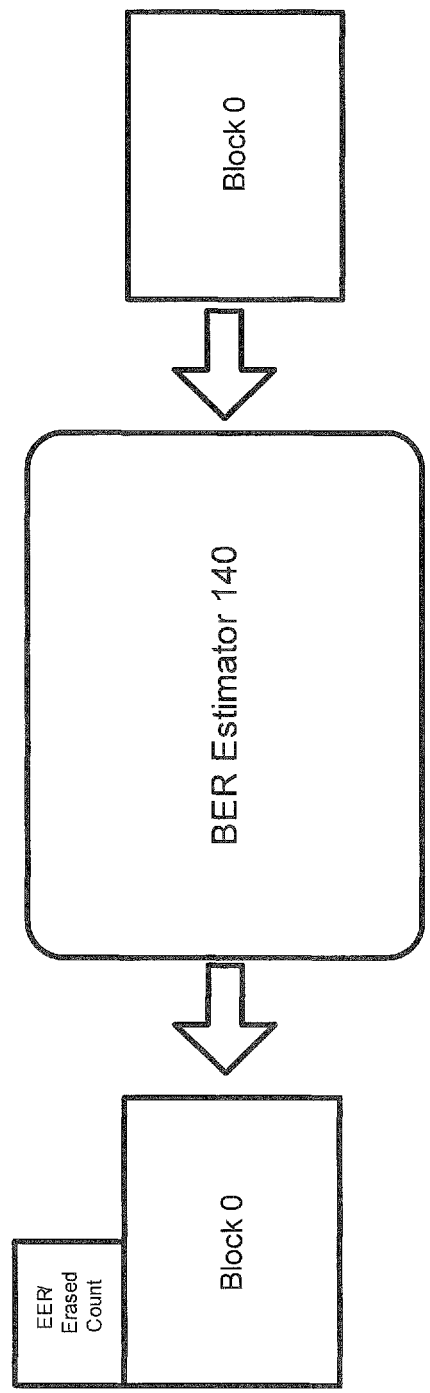
FIG. 10 illustrates one example of operation of the bit error rate (BER) estimator.
Figure 11:
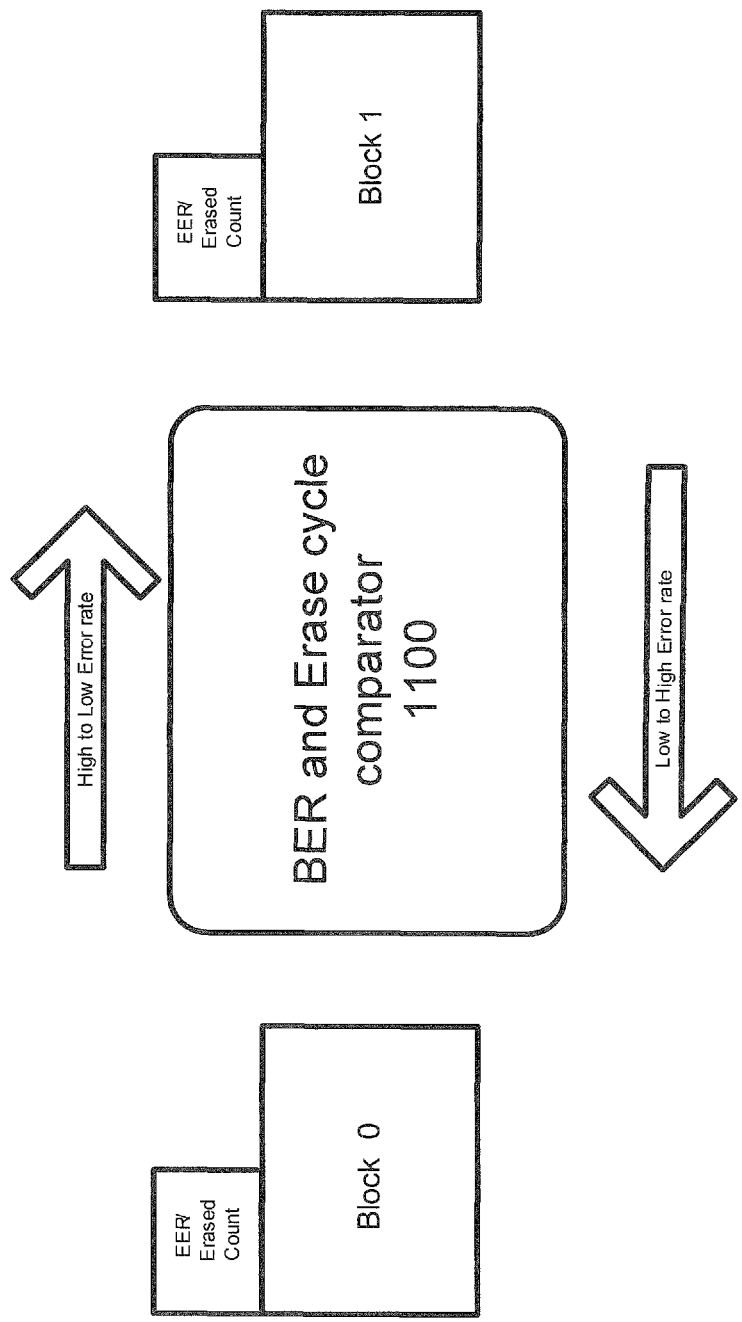
FIG. 11 illustrates one example of use of the bit error rate and the erased count.

At 804, a bit error probability is generated based on the analysis. At 806, the bit error probability is stored. As one example discussed above, the bit error probability for the block may be stored in a list, and may be arranged or sorted within the list to indicate the bit error probability for the block relative to other free blocks. FIG. 9 illustrates one example of a plurality of blocks with associated bit error rates and erased counts. As discussed above, the blocks may be arranged in one of multiple ways. For example, the blocks may be sorted lowest to highest according to bit error rate so that the block in position 0 is allocated first. FIG. 10 illustrates an example of operation of the bit error rate (BER) estimator 140 in which a block (such as Block 0) is analyzed. As illustrated in FIG. 7, the BER estimator 140 may analyze the bit error rate and optionally determine the erased count using the erase cycle counter. In this way, the block, which is made available to the free block pool, is analyzed by the BER Estimator 140 either by adding data (including adding the BER and the erased count for the first time) or by updating existing data about the block. FIG. 11 illustrates one example of use of the bit error rate and the erased count in which wear balancing 145 includes a BER and Erase cycle comparator 1100 that sorts the blocks by BER and thereafter by erased count.

Returning to flow chart 700, at 706, it is determined whether to select a free block for writing. If so, at 708, the free block list may be accessed. At 720, the block (or blocks) are selected that have the lowest bit error rate probability. At 712, it is determined whether multiple blocks that are selected have the same bit error probability. If so, at 716, the blocks with the lowest erased count are selected. If not, at 714, the selected block is used as the free block.

As discussed above, the bit error rate may be an indicator of the condition of a block in the memory 155. Further, as discussed in U.S. application Ser. No. 12/401,629 (U.S. Published Application No. 2010/0005370), the bit error rate may be used to determine the error correction coding (ECC) that is used. For example, the memory system 110 assigns a more robust ECC (e.g., more computationally intensive and/or more memory requirements) to correct for a higher bit error rate associated with a first block. As another example, the memory system 110 assigns a less robust ECC (e.g.; less computationally intensive and/or less memory requirements) to correct for a lower bit error rate associated with a second block.

In another aspect, a block may be allocated for use depending on the type of data stored in the block. Different types of data may be stored in the memory 155 of memory system 110. As discussed above, two types of data are flash management data and host data. The memory system 110 may use the types of data differently. For example, the memory system 110 may typically access one type of data (such as flash management data) more often than another type of data (such as host data).

In this way, the memory system 110 may select blocks for storage of data based on the specific type of data stored. As one example, the memory system 110 may select blocks for storage of data based on the specific type of data stored and based on an indication of age of the block. Blocks within the memory may have different life spans, with the indication of age being an indication of the life span of a respective block. As discussed above, one indication of age of the block is bit error probability. So that, since some or all of the flash management data typically is used more often than host data, the memory system 110 may store the flash management data in blocks that are in better condition (e.g., having a lower bit error rate). In this way, the memory system 110 may use a less robust ECC, which requires lower computational and/or memory requirements, to correct for errors in the block selected to store flash management data. In the event that the memory system 110 accesses the flash management data often (e.g., more often than host data), the memory system 110 may access the flash management data more efficiently due to the less robust ECC. As another example, the memory system 110 may store the host data in blocks that are in worse condition (e.g., having a higher bit error rate). In this way, the memory system 110 may use a more robust ECC, which requires higher computational and/or memory requirements, to correct for errors in the block selected to store host data. So that, the memory system 110 accesses to both host data and flash management data may be more efficient.

Figure 12:
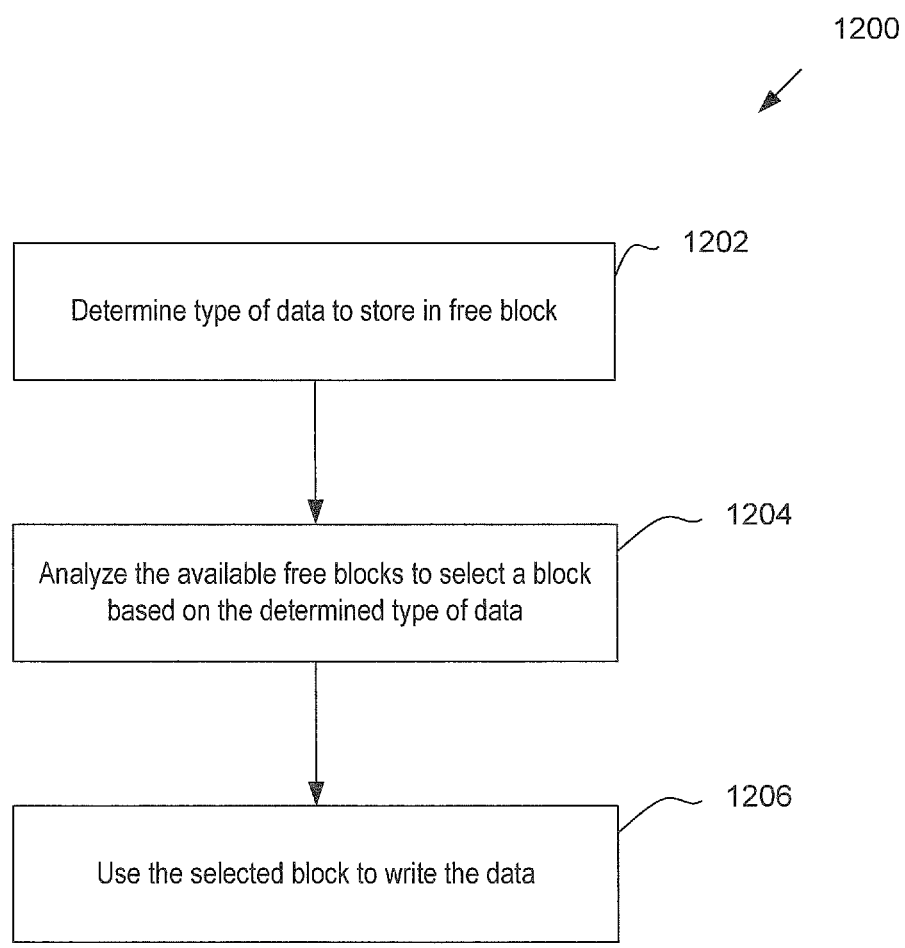
FIG. 12 illustrates one flow chart for selecting a free block for use based on the type of data to be stored in the free block.

FIG. 12 illustrates one flow chart 1200 for selecting a free block for use based on the type of data to be stored in the free block. The processor 120 executing block selector based on data type instructions 150 may achieve the functionality described in flow chart 1200 or 1300 (described below). At 1202, the type of data to store in the free block is determined. As discussed above, there are multiple types of data, including, for example, flash management data and host data. In addition or alternatively, the memory system 110 may determine a sub-type of data. For example, the flash management data includes data that is relatively static (e.g., GAT, CBI, EBL and MAP) and data that is frequently changing and accessed (e.g., ABL and CBL). The memory system 110 may thus select a sub-type of data, such as frequently changing and accessed data, for blocks having a lower bit error rate.

At 1204, one or more of the available free blocks are analyzed to select a block based on the predetermined type of data. The analysis of the free blocks may be performed at one or more times in the operational life of the memory system 110. For example, as the memory system 110 undergoes a production format, the blocks in the memory system may be allocated for a specific type of data (such as for flash management data or host data). In addition (or instead of), the memory system 110 may allocate the blocks during operation of the memory system 110. In particular, when a block is being re-allocated for use (and potentially as a flash management data block), the memory system 110 may perform the analysis. In this way, in one embodiment, the memory system may invoke block selector based on data type instructions 150 every time a flash management data block is needed.

Figure 15:
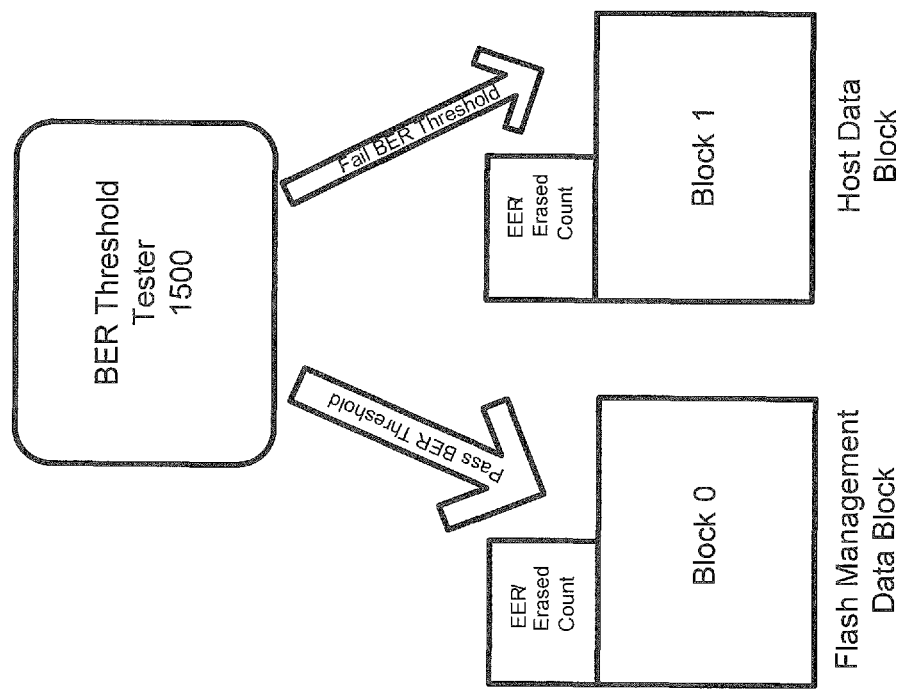
FIG. 15 illustrates one example of operation of the BER threshold tester.

One of several types of analysis may be performed. In one embodiment, the blocks are analyzed an indication of age, such as error rates. For example, the memory system 110 may write a small amount of test data to the block, and use the BER estimator instructions 140 for the block under test. More specifically, if the bit error rate (as determined by the BER estimator instructions 140) is less than or equal to a minimum threshold, the block is allocated as a flash management data block. An example of this is depicted in FIG. 15 in which the BER Threshold tester 1500, which may be a part of block selector based on data type instructions 150, is invoked to determine whether to allocate a block for flash management data or host data. As shown in FIG. 15, Block 0 passed the BER threshold and is allocated as a flash management data block whereas Block 1 failed the BER threshold and is allocated as a host data block.

In practice, as the memory device undergoes production formats, blocks may be reserved and allocated as flash management data blocks. The reserved blocks are of sufficient quality (e.g., error rates for the blocks are less than a predetermined amount) to ensure better performance of the memory system. At production time, as blocks are allocated, a small amount of test data is written to the block, which ensures removal of factory data that is not usable for the present analysis. The BER Estimator 140 may be invoked on the block under test to generate the bit error rate. Blocks below the minimum threshold (i.e., of lower quality) are not allocated as flash management data blocks. Alternatively, another algorithm, other than the BER Estimator 140, may be utilized to establish a bit error rate. In this way, blocks of flash memory that are utilized by the memory system 110 to store flash management data are of good quality (e.g., a predetermined minimum quality) for better performance of the memory system.

In another embodiment, the blocks may be analyzed for erased counts. For example, blocks with lower erased counts may be allocated as flash management data blocks and blocks with higher erased counts may be allocated as host data blocks. As another example, blocks with erased counts lower than a predetermined erased count may be allocated as flash management data blocks and blocks with erased counts equal to or higher than the predetermined erased count may be allocated as host data blocks.

Figure 13:
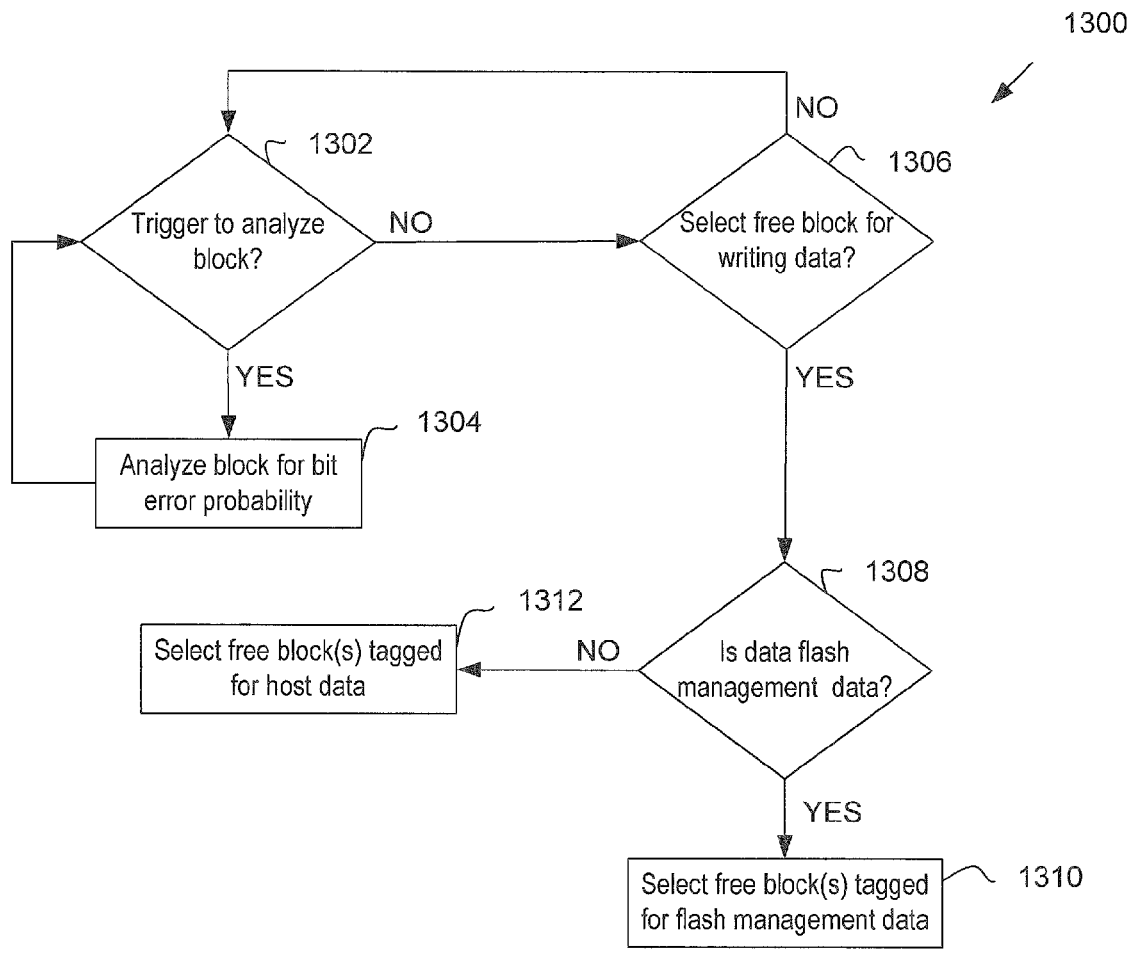
FIG. 13 illustrates another flow chart for selecting a free block for use based on the type of data to be stored in the free block and based on the bit error probability.

FIG. 13 illustrates another flow chart 1300 for selecting a free block for use based on the type of data to be stored in the free block and based on the bit error probability. At 1302, it is determined whether there is a trigger to analyze the block. As discussed above, the trigger may be generated at production time, or may be generated during operation upon reallocation of a block. At 1304, the block is analyzed for bit error probability.

Figure 14:
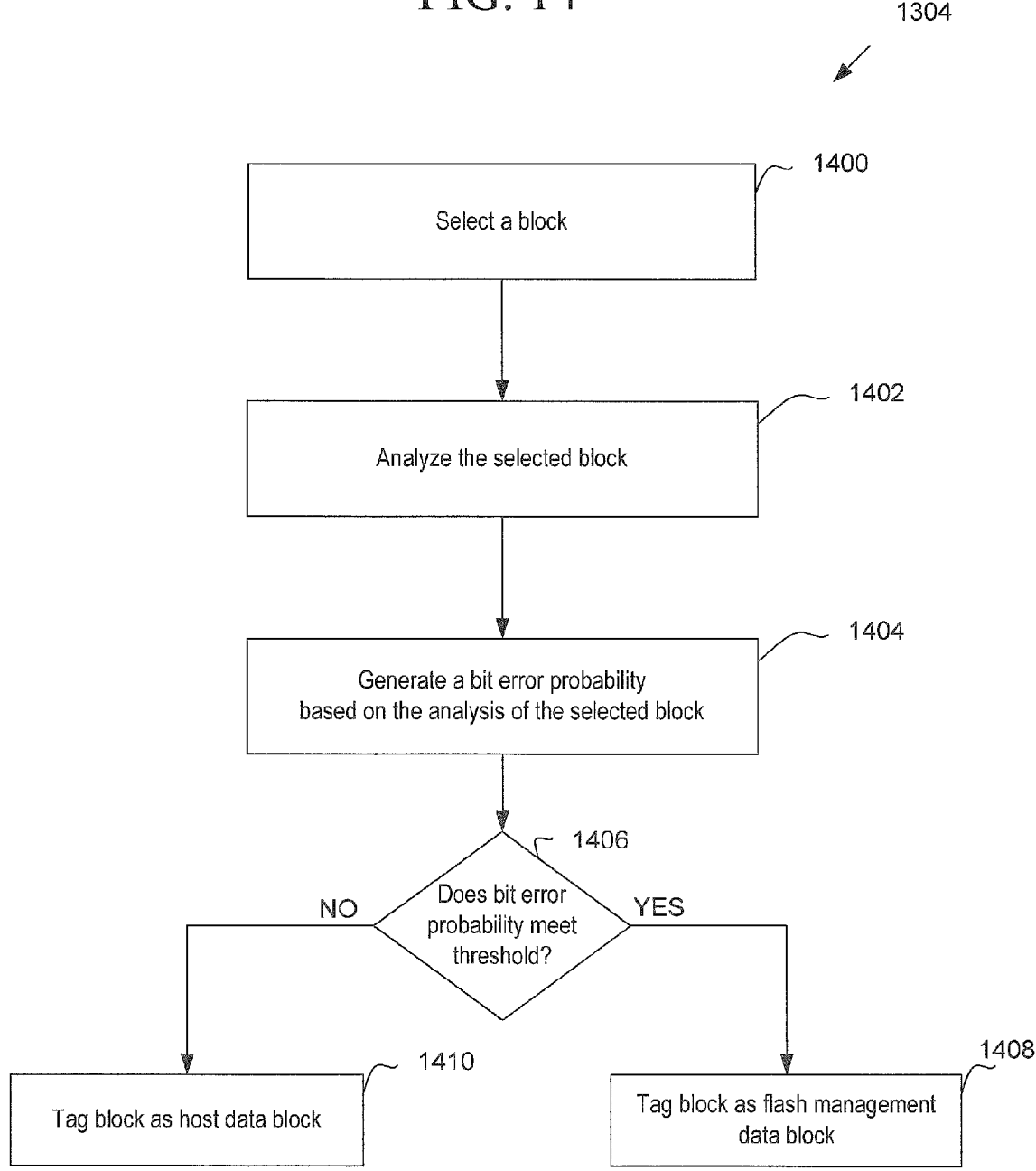
FIG. 14 illustrates a flow chart to generate the bit error probability that is used in FIG. 13.

FIG. 14 illustrates an expansion of 1304, illustrating analysis of the bit error probability. At 1400, the block for analysis is selected. At 1402, the block is analyzed. An example of the analysis is disclosed in U.S. application Ser. No. 12/401,629 (U.S. Published Application No. 2010/0005370), incorporated by reference herein in its entirety. The analysis may generate a reliability of the block, and may be based on analysis of the bits in the block. In one example, the analysis may comprise reading one or more bits from the block and inferring a reliability of the read bits from the values of the read bits (e.g., using reliability information derived from correlation between different bits sharing a common cell). Alternatively, the analysis may comprise utilizing reliability information derived from the locations in which individual bits are stored within the cells of the memory device 110.

At 1404, a bit error probability is generated based on the analysis. At 1406, it is determined whether the bit error probability meets a predetermined threshold. If so, at 1408, the block is tagged as a flash management data block. If not, at 1410, the block is tagged as a host data block.

Returning to flow chart 1300, at 1306, it is determined whether to select a free block for writing. If so, at 1308, it is determined whether the data to write to the selected block is flash management data. If the data is flash management data, at 1310, one or more free blocks are selected that are tagged to store flash management data. If the data is host data, at 1308, one or more free blocks are selected that are tagged to store host data.

Accordingly, the method and system may be realized in hardware, software, or a combination of hardware and software. The method and system may be realized in a centralized fashion in at least one electronic device (such as illustrated in memory system 110 in FIG. 1) or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, such as a computer readable medium, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The computer-readable medium may be a single hardware medium, such as disclosed in controller memory 125, that stores one or more sets of instructions, such as BER estimator 140, wear balancing 145, and block select based on data type 150. The computer-readable medium may be capable of storing, encoding or carrying the one or more sets of instructions for execution by a processor (such as processor 120) to perform any one or more of the methods or operations disclosed herein, including for example, the flow diagrams illustrated in FIGS. 7-8 and 12-14.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents.

What is claimed is:

1. A method for selecting a free block for erasing in a storage device, the method comprising:
in the storage device having a controller and a memory in communication with the controller:
accessing a first bit error probability for a first free block in the storage device;
accessing a first erased count for the first free block, the first erased count indicative of a number of erases of the first free block;
accessing a second bit error probability for a second free block in the storage device;
accessing a second erased count for the second free block, the second erased count indicative of a number of erases of the second free block;
analyzing the first bit error rate probability, the second bit error rate probability, the first erased count, and the second erased count; and
selecting as the free block for erasing the first free block or the second free block based on the analysis.

2. The method of claim 1, wherein the first bit error probability comprises a first bit error rate estimation; and
wherein the second bit error probability comprises a second bit error rate estimation.

3. The method of claim 2, wherein the first bit error probability is generated in response to determining that the first free block is a free block.

4. The method of claim 3, wherein analyzing the first bit error rate probability and the second bit error rate probability comprises compiling a list of free blocks, the list of free blocks organized based on bit error probability of the blocks in the list of free blocks.

5. The method of claim 4, wherein the free blocks in the list are ranked according to the bit error probability of the free blocks.

6. The method of claim 2, wherein analyzing the first erased count and the second erased count comprises comparing the first erased count with the second erased count.

7. The method of claim 6, wherein analyzing the first bit error rate probability and the second bit error rate probability comprises:
compiling a list of free blocks, the list of free blocks organized based on bit error probability of the blocks in the list of free blocks; and
ranking free blocks with a same bit error rate probability according to erased count.

8. The method of claim 2, wherein, in response to determining that the first bit error rate probability is equal to the second bit error rate probability, the first erased count and the second erased count are accessed;
wherein analyzing the first erased count and the second erased count comprises comparing the first erased count with the second erased count in order to determine which one of the first free block or the second free block has a lower erased count; and
wherein the first free block or the second free block with the lower erased count is selected for erasing.

9. A memory device comprising:
a memory; and
a controller in communication with the memory, the controller configured to:
access a first bit error probability for a first free block in the memory;
access a first erased count for the first free block, the first erased count indicative of a number of erases of the first free block;
access a second bit error probability for a second free block in the memory;
access a second erased count for the second free block, the second erased count indicative of a number of erases of the second free block;
analyze the first bit error rate probability, the second bit error rate probability, the first erased count, and the second erased count; and
select as the free block for erasing the first free block or the second free block based on the analysis.

10. The memory device of claim 9, wherein the first bit error probability comprises a first bit error rate estimation; and
wherein the second bit error probability comprises a second bit error rate estimation.

11. The memory device of claim 10, wherein the controller is configured to generate the first bit error probability in response to determining that the first free block is a free block.

12. The memory device of claim 11, wherein the controller is configured to compare the first bit error rate probability with the second bit error rate probability by compiling a list of free blocks, the list of free blocks organized based on bit error probability of the blocks in the list of free blocks.

13. The memory device of claim 12, wherein the free blocks in the list are ranked according to the bit error probability of the free blocks.

14. The memory device of claim 10, wherein the controller is configured to analyze the first erased count and the second erased count by comparing the first erased count with the second erased count.

15. The memory device of claim 14, wherein the controller is configured to analyze the first bit error rate probability and the second bit error rate probability by:
   compiling a list of free blocks, the list of free blocks organized based on bit error probability of the blocks in the list of free blocks; and
   rank free blocks with a same bit error rate probability according to erased count.

16. The memory device of claim 10, wherein, in response to determining that the first bit error rate probability is equal to the second bit error rate probability, the controller is further configured to access the first erased count and the second erased count;
   wherein the controller is configured to analyze the first erased count and the second erased count by comparing the first erased count with the second erased count in order to determine which one of the first free block or the second free block has a lower erased count; and
   wherein the controller is configured to select one of the first free block or the second free block with the lower erased count for erasing.

17. A method for selecting a block for storing data in a storage device, the method comprising:
   in the storage device having a controller and a memory in communication with the controller:
      accessing a bit error probability for a block in the storage device;
      accessing an erased count for the block, the erased count indicative of a number of erases of the block;
      designating, based on the bit error probability and the erased count, the block as at least one of a host data block or a memory management data block;
      determining a type of the data for storage in the block, the type of data selected from host data or memory management data;
      determining whether to store the data in the block based on whether the type of data is host data or memory management data and based on whether the block is designated as the host data block or the memory management data block.

18. The method of claim 17, wherein the bit error probability comprises a bit error rate estimation.

19. The method of claim 17, further comprising generating the bit error probability for the block.

20. The method of claim 19, wherein designating the block is performed prior to determining the type of the data for storage in the block.

21. The method of claim 20, wherein determining whether to designate the block as a host data block for storing of the host data or a memory management data block for storing the memory management data comprises comparing the bit error probability with a predetermined threshold in order to determine whether to designate the block as a host data block or a memory management data block.

22. The method of claim 20, wherein determining whether to store the data in the block based on the type of data and based on whether the block is designated as the host data block or the memory management data block comprises:
   in response to determining that the type of data is the host data and the block is designated as a host data block, determining to store the host data in the data block; and
   in response to determining that the type of data is the memory management data and the block is designated as a memory management data block, determining to store the memory management data in the data block.

23. A memory device comprising:
   a memory; and
   a controller in communication with the memory, the controller programmed for selecting a block for storing data by being configured to:
      access a bit error probability for a block in the storage device;
      access an erased count for the block, the erased count indicative of a number of erases of the block;
      designate, based on the bit error probability and the erased count, the block as at least one of a host data block or a memory management data block;
      determine a type of the data for storage in the block, the type of data selected from host data or memory management data;
      determine whether to store the data in the block based on whether the type of data is host data or memory management data and based on whether the block is designated as the host data block or the memory management data block.

24. The method of claim 23, wherein the bit error probability comprises a bit error rate estimation.

25. The method of claim 23, wherein the controller is further configured to generate the bit error probability for the block.

26. The memory device of claim 24, wherein the controller is configured to designate the block prior to determining the type of the data for storage in the block.

27. The memory device of claim 26, wherein the controller is configured to determine whether to designate the block as a host data block for storing of the host data or a memory management data block for storing the memory management data by comparing the bit error probability with a predetermined threshold in order to determine whether to designate the block as a host data block or a memory management data block.

28. The memory device of claim 26, wherein the controller is configured to determine whether to store the data in the block by:
   in response to determining that the type of data is the host data and the block is designated as a host data block, determining to store the host data in the data block; and
   in response to determining that the type of data is memory management data and the block is designated as a memory management data block, determining to store the memory management data in the data block.

* * * * *